(12) United States Patent
He

(10) Patent No.: US 11,824,149 B1
(45) Date of Patent: Nov. 21, 2023

(54) LED LAMP BEAD AND LED LAMP GROUP

(71) Applicant: SHANGYOU JIAYI LIGHTING PRODUCT CO., LTD., Jiangxi (CN)

(72) Inventor: Yaowen He, Ganzhou (CN)

(73) Assignee: SHANGYOU JIAYI LIGHTING PRODUCT CO., LTD., Jiangxi (CN)

( * ) Notice: Subject to any disclaimer, the term of this patent is extended or adjusted under 35 U.S.C. 154(b) by 0 days.

(21) Appl. No.: 18/080,386

(22) Filed: Dec. 13, 2022

(30) Foreign Application Priority Data

Sep. 26, 2022 (CN) .......................... 202222552096.5

(51) Int. Cl.
*H01L 33/62* (2010.01)
*H01L 27/15* (2006.01)
*H01L 33/48* (2010.01)

(52) U.S. Cl.
CPC .............. *H01L 33/62* (2013.01); *H01L 27/15* (2013.01); *H01L 33/486* (2013.01)

(58) Field of Classification Search
CPC ....... H01L 33/62; H01L 33/486; H01L 33/54; H01L 25/167; H01L 25/165; H05B 33/12
See application file for complete search history.

(56) References Cited

FOREIGN PATENT DOCUMENTS

CN 218160373 U * 12/2022
CN 218586009 U * 3/2023 ........... H01L 25/075

* cited by examiner

*Primary Examiner* — Antonio B Crite
(74) *Attorney, Agent, or Firm* — Fleit Intellectual Property Law; Paul D. Bianco; Gary S. Winer

(57) ABSTRACT

Disclosed are an LED lamp bead and an LED lamp group. The LED lamp bead includes a light-emitting body and a light-bead bracket; and the lamp-bead bracket includes a light-emitting body fixing structure and a drive circuit; the light-emitting body fixing structure is configured for fixing the light-emitting body, and the drive circuit is connected with the light-emitting body, for driving the light-emitting body to emit light in response to a lamp bead trigger signal; and the drive circuit includes an input pin and power supply pins, the power supply pins are connected to a power supply, and the input pin is configured to receive the lamp bead trigger signal and transmit it to the drive circuit, so that the drive circuit drives the light-emitting body to emit light. The LED lamp bead provided by the present application drives the light-emitting body to emit light through the drive circuit.

17 Claims, 3 Drawing Sheets

LED LAMP BEAD AND LED LAMP GROUP

TECHNICAL FIELD

The present application relates to the technical field of LED lamp beads, in particular to an LED lamp bead and an LED lamp group.

BACKGROUND ART

Most of the existing Symphony point-controlled lamp beads are connected in series with signals, wherein an output of signal of the current lamp bead is connected with an input of signal of the next lamp bead. In this way, if the current bead is damaged, the next bead, or even all the beads connected behind the current bead, will be prone to be unable to receive the control signal and thus cannot be lit normally.

Each of the existing Symphony point-controlled lamp beads comprises a signal input end and a signal output end. When the lamp beads are packaged by wire bonding in the above-mentioned series connection method, in order to make the signals of all lamp beads communicated, the welding pin brackets need to be arranged at the signal input end and the signal output end respectively, and the signal output line is needed to be welded, so as to make the welding pin bracket at the signal output end of one lamp bead connect with the welding pin bracket at the signal input end of the adjacent lamp bead at the rear end thereof. This packaging structure of the lamp bead not only has more packaging processes, but also has poor adaptability when the lamp bead is lit by the signal.

SUMMARY

In view of this, the purpose of the present application is to provide an LED lamp bead and an LED lamp group. The LED lamp bead works independently, ensuring that each LED lamp bead in the LED lamp group can be lit under normal conditions and have a good adaptability.

In the first aspect, an embodiment of the present application provides an LED lamp bead. The LED lamp bead comprises a light-emitting body and a lamp bead bracket; and the lamp bead bracket comprises a light-emitting body fixing structure and a drive circuit; the light-emitting body fixing structure is configured for fixing the light-emitting body, and the drive circuit is connected with the light-emitting body, for driving the light-emitting body to emit light in response to a lamp bead trigger signal; and the drive circuit comprises an input pin and power supply pins, the power supply pins are connected to a power supply, and the input pin is configured to receive the lamp bead trigger signal and transmit it to the drive circuit, so that the drive circuit drives the light-emitting body to emit light.

In conjunction with the first aspect, the embodiment of the present application provides a first possible embodiment of the first aspect, wherein the LED lamp bead further comprises a lamp bead cover, and the lamp bead cover is mounted on the light-emitting body fixing structure and configured to form a lamp cover structure of the light-emitting body.

In conjunction with the first aspect, the embodiment of the present application provides a second possible embodiment of the first aspect, wherein the drive circuit comprises an IC chip and a light-emitting body control chip connected thereto, and the light-emitting body control chip corresponds to the light-emitting body; the IC chip is configured for acquiring the lamp bead trigger signal and sending the lamp bead trigger signal to the light-emitting body control chip; and the light-emitting body control chip is configured for receiving the lamp bead trigger signal to trigger the light-emitting body to emit light.

In conjunction with the first aspect, the embodiment of the present application provides a third possible embodiment of the first aspect, wherein communication contacts and a signal input contact are provided on the IC chip; the signal input contact is configured for connecting with the input pin, for transmitting the lamp bead trigger signal to the IC chip; and the IC chip is configured to send the lamp bead trigger signal to the light-emitting body control chip through the communication contacts, so as to trigger the light-emitting body to emit light.

In conjunction with the first aspect, the embodiment of the present application provides a fourth possible embodiment of the first aspect, wherein the light-emitting body comprises a plurality of light-emitting bodies of different colors, and the light-emitting body control chip comprises light-emitting sub-chips corresponding to individual light-emitting bodies; each of the light-emitting sub-chip is configured for receiving the lamp bead trigger signal to trigger the corresponding light-emitting body to emit light; and the communication contacts of the IC chip comprise communication contacts corresponding to individual light-emitting sub-chips, and each of the communication contacts is connected to a corresponding light-emitting sub-chip.

In conjunction with the first aspect, the embodiment of the present application provides a fifth possible embodiment of the first aspect, wherein the plurality of light-emitting bodies of different colors comprise R, G, and B light-emitting bodies.

In conjunction with the first aspect, the embodiment of the present application provides a sixth possible embodiment of the first aspect, wherein the power supply pins comprise a positive pin and a negative pin, the positive pin is connected with the light-emitting body control chip, and the negative pin is connected with the IC chip, wherein the IC chip further comprises an IC positive electrode and an IC negative electrode, the IC positive electrode is connected to the positive pin, and the IC negative electrode is connected to the negative pin; and the light-emitting body control chip comprises a chip positive electrode and a chip negative electrode, the chip positive electrode is connected to the positive pin, and the chip negative electrode is connected to the IC chip.

In conjunction with the first aspect, the embodiment of the present application provides a seventh possible embodiment of the first aspect, wherein the positive pin, the negative pin and the input pin are arranged horizontally in sequence from left to right.

In conjunction with the first aspect, the embodiment of the present application provides a eighth possible embodiment of the first aspect, wherein the light-emitting body fixing structure comprises a plug-in structure or a patch structure.

In the second aspect, an embodiment of the present application further provides an LED lamp group, wherein the LED lamp group is provided with a plurality of the LED lamp beads mentioned above.

The embodiments of the present application bring about the following beneficial effects. As for the LED lamp bead and the LED lamp group provided by the present application, the LED lamp bead drives the light-emitting body to emit light through the drive circuit, and the light-emitting operation of each LED lamp bead included in the LED lamp group does not need to be performed according to the signal outputs of other LED lamp beads, and each LED lamp bead works independently, ensuring that each LED lamp bead in the LED lamp group can be lit under normal conditions.

Other features and advantages of the present application will be set forth in the description below, and will be partially apparent from the description or may be learned by practice of the present application. The objects and other advantages of the present application will be realized and attained by the structure particularly pointed out in the description and the drawings.

In order to make the above-mentioned objects, features and advantages of the present application more obvious and easy to be understood, preferred embodiments are given below and are described in detail as follows in conjunction with the drawings.

BRIEF DESCRIPTION OF DRAWINGS

In order to more clearly illustrate the specific embodiments of the present application or the technical solutions in the prior art, the drawings that need to be used in the description of the embodiments or the prior art will be briefly introduced below. Obviously, the drawings in the following descriptions show some embodiments of the present application. For those skilled in the art, other drawings can also be obtained based on these drawings without creative efforts.

Figure 1:
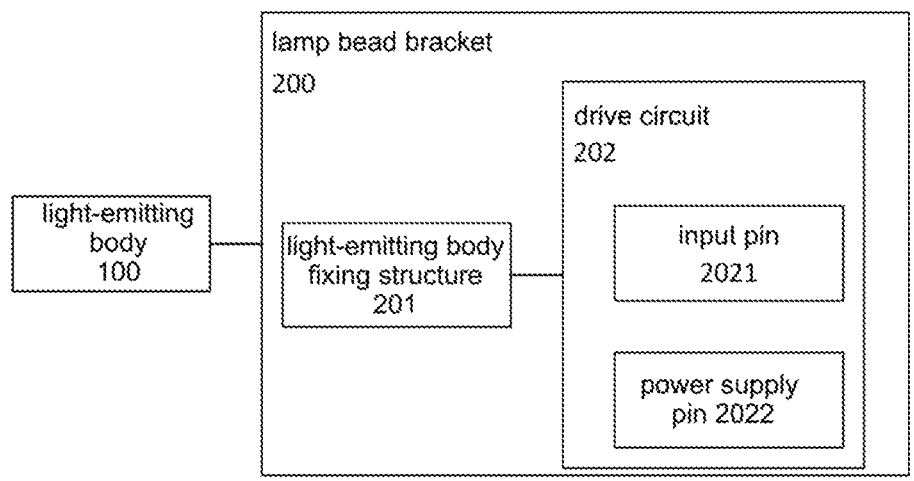
FIG. 1 is a schematic structural diagram of an LED lamp bead provided by an embodiment of the present application.

In the drawings: 1—IC negative electrode; 2—signal input contact; 3—IC positive electrode; 4—red light-emitting sub-chip negative electrode; 5—green light-emitting sub-chip negative electrode; 6—blue light-emitting sub-chip negative electrode; 7—green light-emitting sub-chip positive electrode; 8—blue light-emitting sub-chip positive electrode; 9—red light-emitting sub-chip positive electrode; 101—light-emitting body; 102—lamp bead cover; 200—lamp bead bracket; 201—light-emitting body fixing structure; 202—drive circuit; 2021—input pin; 2022—power supply pin; 302—positive pin; 301—negative pin; 401—IC chip; 402—light-emitting control chip.

DETAILED DESCRIPTION OF EMBODIMENTS

In order to make the purposes, technical solutions and advantages of the embodiments of the present application clearer, the technical solutions of the present application will be described clearly and completely below in conjunction with the drawings. Obviously, the described embodiments are part, but not all, of the embodiments of the present application. Based on the embodiments of the present application, all other embodiments, obtained by those skilled in the art without creative works, fall within the protection scope of the present application.

The existing Symphony point-controlled lamp beads are all connected in series with signals. The signal output of the current lamp bead is connected with the signal input of the next lamp bead. In this way, a damage of current lamp bead will cause that the next lamp bead, or even all the lamp beads connected behind the current lamp bead, are prone to not able to get the control signal and thus not able to be lit normally.

Each of the existing Symphony point-controlled lamp beads comprises a signal input end and a signal output end. When the lamp beads are packaged by wire-bonding in the above-mentioned series connection method, in order to make the signals of all the lamp beads communicated, the welding pin brackets need to be arranged at the signal input end and the signal output end respectively, and the signal output line is needed to be welded, so as to make the welding pin bracket at the signal output end of one lamp bead connect with the welding pin bracket at the signal input end of the adjacent lamp bead at the rear end thereof. This packaging structure of a lamp bead not only has more packaging processes, but also has poor adaptability when the lamp bead is lit by the signal.

Based on this, the embodiments of the present application provide an LED lamp bead and an LED lamp group. The LED lamp beads work independently, ensuring that each LED lamp bead in the LED lamp group can be lit under normal conditions.

In order to facilitate the understanding on this embodiment, an LED lamp bead disclosed in the embodiment of the present application is first introduced in detail. FIG. 1 is a schematic structural diagram of an LED lamp bead provided by the embodiment of the present application. As shown in FIG. 1, the LED lamp bead comprises a light-emitting body 101 and a lamp bead bracket 200; the lamp bead bracket 200 comprises a light-emitting body fixing structure 201 and a drive circuit 202; the light-emitting body fixing structure 201 is used to fix the light-emitting body 101, and the drive circuit 202 and the light-emitting body 101 are connected, for driving the light-emitting body 101 to emit light in response to a lamp bead trigger signal; the drive circuit 202 comprises an input pin 2021 and a power supply pin 2022, the power supply pin 2022 is connected to the power supply, and the input pin 2021 is used for receiving the lamp bead trigger signal and transmit it to the drive circuit 202, so that the drive circuit 202 drives the light-emitting body 101 to emit light.

In a specific implementation, each LED lamp bead comprises a drive circuit 202. After receiving the lamp bead trigger signal, the drive circuit 202 drives the light-emitting body 101 to emit light according to the lamp bead trigger signal, wherein the drive circuit 202 is fixed to the light-emitting body fixing structure 201, so that the light-emitting body 101 and the drive circuit 202 are connected with each other.

The LED lamp bead provided by the embodiment of the present application drives the light-emitting body 101 to emit light through the drive circuit 202, and each LED lamp bead included in the LED lamp group does not need to realize the light-emitting work according to the signal output of other LED lamp beads. Each of the lamp beads works independently, ensuring that each LED light bead in the LED light group can be lit under normal conditions.

Figure 2:
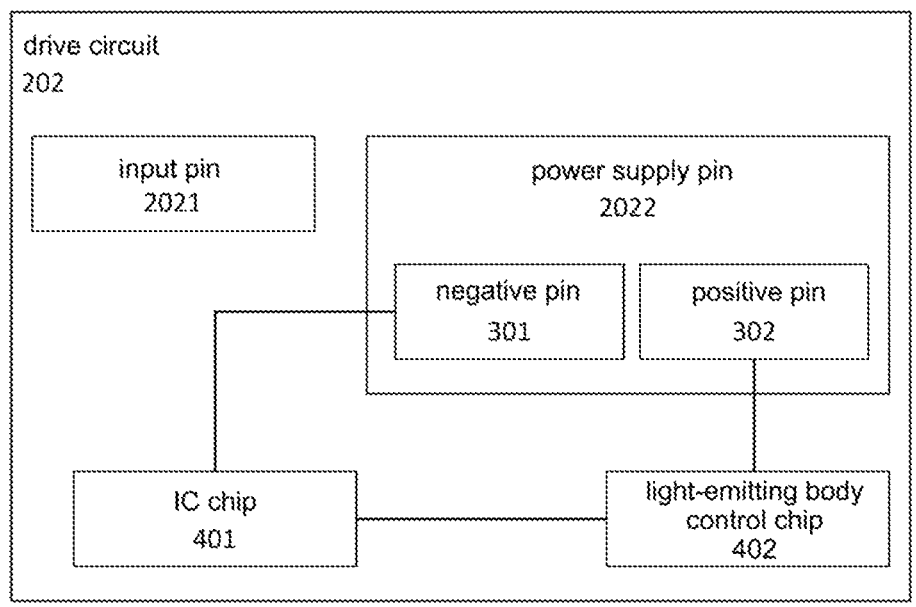
FIG. 2 is a schematic structural diagram of another LED lamp bead provided by an embodiment of the present application.

For ease of understanding, on the basis of the above embodiments of the present application, the embodiments of the present application further provide another LED lamp bead. The another LED lamp bead provided by the embodiments of the present application further comprises a lamp bead cover 102, the lamp bead cover 102 is installed on the light-emitting body fixing structure 201, for forming the lamp cover structure of the light-emitting body 101. Further, the embodiment of the present application is mainly to introduce the specific structure of the drive circuit 202. FIG. 2 shows a schematic structural diagram of another LED lamp bead provided by the present application, wherein FIG. 2 is the schematic structural diagram of the drive circuit 202 of the LED lamp bead. As shown in FIG. 2, the above-mentioned drive circuit 202 comprises an IC chip 401 and a light-emitting body control chip 402 connected to the IC chip 401; the light-emitting body control chip 402 corresponds to the light-emitting body 101; the IC chip 401 is used for acquiring the lamp bead trigger signal and sending it to the light-emitting body control chip 402; the light-emitting body control chip 402 is used for receiving the lamp bead trigger signal to trigger the light-emitting body 101 to emit light. Here, the above-mentioned power supply pins 2022 comprise a positive pin 302 and a negative pin 301, the positive pin 302 is connected to the light-emitting body control chip 402, and the negative pin 301 is connected to the IC chip 401.

In a specific implementation, the IC chip 401 is provided thereon with communication contacts and a signal input contact 2; the signal input contact is used to connect with the input pin 2021 for transmitting the lamp bead trigger signal to the IC chip 401; the IC chip 401 is used to send a lamp bead trigger signal to the light-emitting body control chip 402 through the communication contacts, so as to trigger the light-emitting body 101 to emit light.

In a specific implementation, light-emitting body 101 of the LED lamp bead comprises a plurality of light-emitting bodies 101 of different colors, and the light-emitting body control chip 402 of the drive circuit 202 comprises light-emitting body sub-chips corresponding to individual light-emitting bodies 101. The light-emitting body sub-chip is used for receiving the lamp bead trigger signal to trigger the corresponding light-emitting body 101 to emit light. The communication contacts of the IC chip 401 comprise communication contacts corresponding to individual light-emitting sub-chips, and each communication contact is connected to the corresponding light-emitting sub-chip. Specifically, the above-mentioned plurality of light-emitting bodies 101 of different colors may comprise R, G, and B light-emitting bodies. In this case, the above-mentioned light-emitting sub-chips comprise the red light-emitting sub-chip corresponding to the R light-emitting body, the green light-emitting sub-chip corresponding to the G light-emitting body, and the blue light-emitting sub-chip corresponding to the B light-emitting body.

Figure 3:
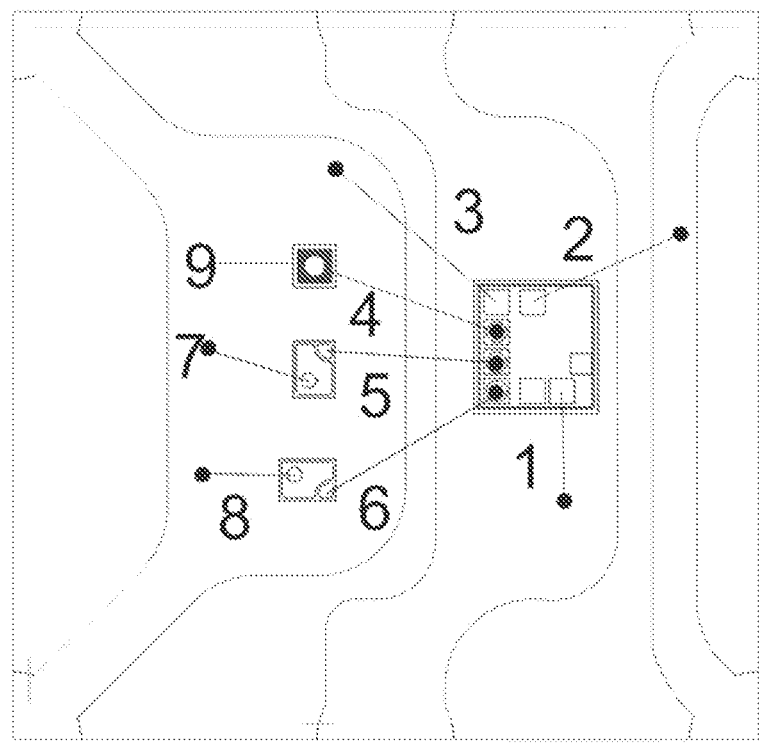
FIG. 3 is a schematic diagram of a specific structure of a drive circuit provided by an embodiment of the present application.

FIG. 3 is a schematic diagram of the specific structure of the drive circuit 202. In FIG. 3, a plurality of light-emitting bodies 101 of different colors including R, G, and B light-emitting bodies are used as an example for illustration. At this time, the communication contacts of the IC chip 401 comprise communication contacts corresponding respectively to the above three light-emitting sub-chips. As shown in FIG. 3, four chip structures are shown in FIG. 3. Each of the three chip structures on the left is one of the three light-emitting sub-chips above. These three light-emitting sub-chips are all connected to the positive pin 302 of the power supply pin 2022. Specifically, the first chip is a red light-emitting sub-chip, the second chip is a green light-emitting sub-chip, and the third chip is a blue light-emitting sub-chip. Another chip is the above-mentioned IC chip 401, which is connected to the negative pin 301 of the power supply pin 2022. Here, the IC chip 401 is provided thereon with 8 contacts, and the contact 2 is the above-mentioned signal input contact, which is connected to the input pin 2021; the three black circular contacts included in the IC chip 401 are the communication contacts corresponding to the above three light-emitting sub-chips respectively, and each black circular contact is connected to the light-emitting sub-chip on the left side respectively.

Specifically, the light-emitting body control chip 402 comprises a chip positive electrode and a chip negative electrode. The chip negative electrode 4 of the red light-emitting sub-chip is disposed on the top of the red light-emitting sub-chip, the chip negative electrode 5 of the green light-emitting sub-chip is disposed on the right side of the green light-emitting sub-chip, and the chip negative electrode 6 of the blue light-emitting sub-chip is disposed on the right side of the blue light-emitting sub-chip. The chip negative electrodes of the three light-emitting sub-chips are respectively connected to individual communication contacts of the IC chip 401. Further, the chip positive electrodes of the light-emitting body control chip 402 are all connected to the positive pin 302 of the power supply pins 2022, wherein the chip positive electrode of the red light-emitting sub-chip is located at the bottom of the red light-emitting sub-chip, the chip positive electrode of the green light-emitting sub-chip is located at the left side of the green light-emitting sub-chip, and the chip positive electrode of the blue light-emitting sub-chip is located on the left side of the blue light-emitting sub-chip.

In addition, the IC chip 401 further comprises an IC positive electrode and an IC negative electrode. The contact 3 in FIG. 3 is the above-mentioned IC positive electrode, the contact 1 is the above-mentioned IC negative electrode, the IC positive electrode is connected to the positive pin 302 of the power supply pin 2022, and the IC negative electrode is connected to the negative pin 301 of the power supply pin 2022. In a specific implementation, the lamp bead trigger signal is transmitted to the drive circuit 202 through the input pin 2021, and the drive circuit 202 receives the above lamp bead trigger signal through its signal input contact 2 and controls, according to the above lamp bead trigger signal, the light-emitting body control chip 402 to work through the corresponding communication contact, so that the corresponding light-emitting sub-chip drives the corresponding light-emitting body 101 to light up. At this time, the IC positive electrode and the IC negative electrode of the IC chip 401 are respectively connected to the positive pin 302 and the negative pin 301 of the current LED lamp bead, and the current LED lamp bead is only triggered and lit for the lamp bead trigger signal, which will not be transmitted to another LED lamp bead through the positive pin 302 or the negative pin 301, thus making each LED lamp bead work independently.

Further, the positive pin 302, the negative pin 301 and the input pin 2021 of the LED lamp bead provided by the embodiment of the present application are arranged horizontally from left to right in sequence. When the IC chip 401 and the light-emitting body control chip 402 are connected, the chip negative electrode of each light-emitting sub-chip of the light-emitting body control chip 402 can be connected to the corresponding communication contact in a left-right correspondence, and the wiring is simple and clear.

Further, the IC chip 401 and the light-emitting body control chip 402 in the LED lamp bead provided by the embodiment of the present application are connected by bonding wires, and the corresponding connections between the IC chip 401 and the positive pin 302 and the negative pin 301 are also performed by bonding wires. The above-mentioned signal input contact 2 is also connected to the input pin 2021 by bonding wire.

Figure 4:
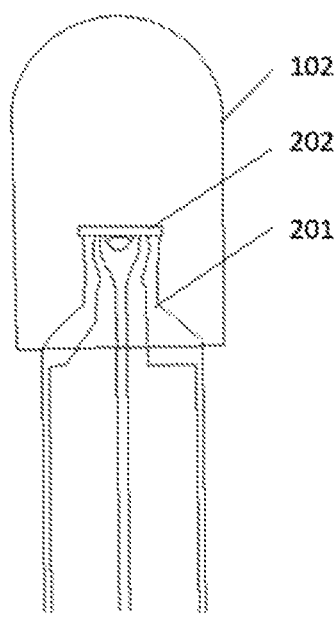
FIG. 4 is a schematic structural diagram of an LED lamp bead provided by an embodiment of the present application in which the light-emitting body fixing structure is a plug-in structure.
Figure 5:
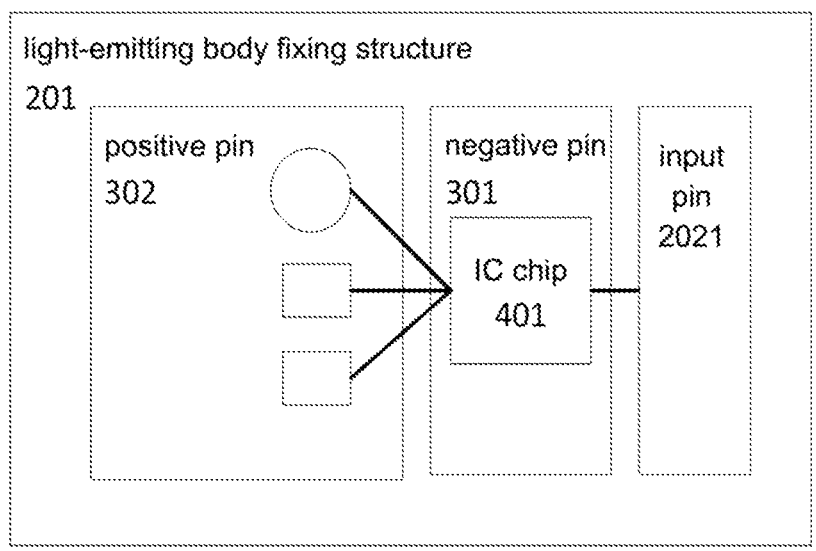
FIG. 5 is a schematic structural diagram of a lamp bead bracket provided by an embodiment of the present application in which the light-emitting body fixing structure is a patch structure.

In a specific implementation, the light-emitting body fixing structure 201 of the above-mentioned LED lamp bead comprises a plug-in structure or a patch structure. Herein, when the light-emitting body fixing structure 201 is a plug-in structure, as shown in FIG. 4 which is the schematic structural diagram of the LED lamp bead when the light-emitting body fixing structure is a plug-in structure, the plug-in structure comprises three pins, and the individual pins are respectively corresponding to the positive pin 302, the negative pin 301 and the input pin 2021. The above three pins are also arranged horizontally from left to right, corresponding to the positive pin 302, the negative pin 301 and the input pin 2021 arranged horizontally from left to right in sequence. When the light-emitting body fixing structure 201 is a patch structure, as shown in FIG. 5 which is the schematic structural diagram of the lamp bead bracket when the light-emitting body fixing structure is a patch structure, the above-mentioned light-emitting body fixing structure 201 further has a pad structure correspondingly. The LED lamp beads are mounted in an LED lamp group including a plurality of LED lamp beads through the pad structure.

Another LED lamp bead provided by the present application is provided with an IC chip 401 and a light-emitting body control chip 402. The IC chip 401 receives the lamp bead trigger signal through the input pin 2021, and drives the light-emitting body control chip 402 through the communication contact according to the lamp bead trigger signal, so as to drive the light-emitting body 101 to light up. The IC chip 401 is connected to the negative pin 301 of the power supply pin 2022, and the light-emitting body control chip 402 is connected to the positive pin 302 of the power supply pin 2022. At this time, the lamp bead trigger signal received from the input pin 2021 forms a closed signal loop between the IC chip 401 and the light-emitting body control chip 402. There is no need to transmit the lamp bead trigger signal to other LED lamp beads, and thus there is no need to provide a pin corresponding to the signal output, which simplifies the structural composition and arrangement manner of the light-emitting body fixing structure 201, thereby reducing the space occupied by a single LED lamp bead.

Based on the above-mentioned embodiment, an embodiment of the present application further provides an LED lamp group, wherein the LED lamp group is provided with a plurality of LED lamp beads as shown in any one of FIG. 1 to FIG. 5. Here, the LED lamp group can determine the lighting mode of each LED lamp bead according to the preset use requirements.

The LED lamp group provided by the embodiment of the present application has the same technical features as the LED lamp bead provided by the above-mentioned embodiments, so that it can also solve the same technical problems and achieve the same technical effects. Those skilled in the art can clearly understand that, for the convenience and brevity of the description, the specific structure of the LED lamp group described above can be obtained by referring to the corresponding structure in the foregoing embodiments of the LED lamp bead, which will not be repeated here.

In addition, in the description of the embodiments of the present application, unless expressly specified and limited otherwise, the terms "installation", "connection with" and "connection to" should be understood in a broad sense. For example, it may be a fixed connection, a detachable connection, or an integral connection; or may be a mechanical connection, or may also be an electrical connection; or may be a direct connection, or may also be an indirect connection through an intermediate medium, or may be an internal communication between two elements. For those skilled in the art, the specific meanings of the above terms in the present application can be understood in specific situations.

In the description of the present application, it should be noted that the orientation or position relationship, indicated by the terms "center", "upper", "lower", "left", "right", "vertical", "horizontal", "inner" and "outer" etc., is based on the orientation or position relationship shown in the drawings, which is only for the convenience of describing the present application and simplifying the description, rather than indicating or implying that the referred device or element must be in a specific orientation, or constructed or operated in a specific orientation. Therefore, it should not be construed as a limitation on the present application. Furthermore, the terms, "first", "second", and "third", are used for descriptive purposes only, and should not be construed to indicate or imply importance of relativity.

Finally, it should be noted that the above embodiments, which are only specific implementations of the present application, are used to illustrate the technical solutions of the present application, rather than restricting them. The protection scope of the present application is not limited to them. Although the present application has been described in detail with reference to the aforementioned embodiments, those skilled in the art should understand that: within the technical scope disclosed by the present application, any person skilled in the art can still make modifications or easily think of changes to the technical solutions recorded in the above embodiments, or make equivalent replacements for some technical features therein. These modifications, changes or replacements do not make the essence of the corresponding technical solutions depart from the spirit and scope of the technical solutions of the embodiments of the present application, and should be covered within the scope of protection of the present application. Therefore, the protection scope of the present application should be subject to the protection scope of the claims.

What is claimed is:

1. An LED lamp bead, comprising a light-emitting body and a lamp bead bracket, wherein the lamp bead bracket comprises a light-emitting body fixing structure and a drive circuit;

the light-emitting body fixing structure is configured for fixing the light-emitting body, and the drive circuit is connected with the light-emitting body, for driving the light-emitting body to emit light in response to a lamp bead trigger signal; and the drive circuit comprises an input pin and power supply pins, the power supply pins are connected to a power supply, and the input pin is configured for receiving the lamp bead trigger signal and transmitting it to the drive circuit, so that the drive circuit drives the light-emitting body to emit light;

wherein the drive circuit comprises an IC chip and a light-emitting body control chip connected to the IC chip, and the light-emitting body control chip corresponds to the light-emitting body;

the IC chip is configured for acquiring the lamp bead trigger signal, and sending the lamp bead trigger signal to the light-emitting body control chip; and the light-emitting body control chip is configured for receiving the lamp bead trigger signal, so as to trigger the light-emitting body to emit light.

2. The LED lamp bead according to claim 1, wherein the LED lamp bead further comprises a lamp bead cover, and the lamp bead cover is mounted on the light-emitting body fixing structure, so as to form a lamp cover structure of the light-emitting body.

3. The LED lamp bead according to claim 1, wherein the light-emitting body fixing structure comprises a plug-in structure or a patch structure.

4. The LED lamp bead according to claim 1, wherein communication contacts and a signal input contact are provided on the IC chip;
the signal input contact is configured for connecting with the input pin, so as to transmit the lamp bead trigger signal to the IC chip; and
the IC chip is configured for sending the lamp bead trigger signal to the light-emitting body control chip through the communication contacts, so as to trigger the light-emitting body to emit light.

5. The LED lamp bead according to claim 4, wherein the light-emitting body comprises a plurality of light-emitting bodies of different colors, and the light-emitting body control chip comprises light-emitting sub-chips corresponding to individual light-emitting bodies;
each of the light-emitting sub-chip is configured for receiving the lamp bead trigger signal to trigger the corresponding light-emitting body to emit light; and
the communication contacts of the IC chip comprise communication contacts corresponding to individual light-emitting sub-chips, and each of the communication contacts is connected to a corresponding light-emitting sub-chip.

6. The LED lamp bead according to claim 5, wherein the plurality of light-emitting bodies of different colors comprises R, G, and B light-emitting bodies.

7. The LED lamp bead according to claim 1, wherein the power supply pins comprise a positive pin and a negative pin, the positive pin is connected to the light-emitting body control chip, and the negative pin is connected to the IC chip,
wherein the IC chip further comprises an IC positive electrode and an IC negative electrode, the IC positive electrode is connected to the positive pin, and the IC negative electrode is connected to the negative pin; and
the light-emitting body control chip comprises a chip positive electrode and a chip negative electrode, the chip positive electrode is connected to the positive pin, and the chip negative electrode is connected to the IC chip.

8. The LED lamp bead according to claim 7, wherein the positive pin, the negative pin and the input pin are arranged horizontally in sequence from left to right.

9. An LED lamp group, wherein the LED lamp group is provided with a plurality of the LED lamp beads according to claim 1.

10. The LED lamp group according to claim 9, wherein each of the plurality of the LED lamp beads further comprises a lamp bead cover, and the lamp bead cover is mounted on the light-emitting body fixing structure, so as to form a lamp cover structure of the light-emitting body.

11. The LED lamp group according to claim 9, wherein the light-emitting body fixing structure comprises a plug-in structure or a patch structure.

12. An LED lamp group, wherein the LED lamp group is provided with a plurality of the LED lamp beads, each of the plurality of LED lamp beads comprising a light-emitting body and a lamp bead bracket, wherein the lamp bead bracket comprises a light-emitting body fixing structure and a drive circuit;
the light-emitting body fixing structure is configured for fixing the light-emitting body, and the drive circuit is connected with the light-emitting body, for driving the light-emitting body to emit light in response to a lamp bead trigger signal; and
the drive circuit comprises an input pin and power supply pins, the power supply pins are connected to a power supply, and the input pin is configured for receiving the lamp bead trigger signal and transmitting it to the drive circuit, so that the drive circuit drives the light-emitting body to emit light;
wherein the drive circuit comprises an IC chip and a light-emitting body control chip connected to the IC chip, and the light-emitting body control chip corresponds to the light-emitting body;
the IC chip is configured for acquiring the lamp bead trigger signal, and sending the lamp bead trigger signal to the light-emitting body control chip; and
the light-emitting body control chip is configured for receiving the lamp bead trigger signal, so as to trigger the light-emitting body to emit light.

13. The LED lamp group according to claim 12, wherein communication contacts and a signal input contact are provided on the IC chip;
the signal input contact is configured for connecting with the input pin, so as to transmit the lamp bead trigger signal to the IC chip; and
the IC chip is configured for sending the lamp bead trigger signal to the light-emitting body control chip through the communication contacts, so as to trigger the light-emitting body to emit light.

14. The LED lamp group according to claim 13, wherein the light-emitting body comprises a plurality of light-emitting bodies of different colors, and the light-emitting body control chip comprises light-emitting sub-chips corresponding to individual light-emitting bodies;
each of the light-emitting sub-chip is configured for receiving the lamp bead trigger signal to trigger the corresponding light-emitting body to emit light; and
the communication contacts of the IC chip comprise communication contacts corresponding to individual light-emitting sub-chips, and each of the communication contacts is connected to a corresponding light-emitting sub-chip.

15. The LED lamp group according to claim 14, wherein the plurality of light-emitting bodies of different colors comprise R, G, and B light-emitting bodies.

16. The LED lamp group according to claim 12, wherein the power supply pins comprise a positive pin and a negative pin, the positive pin is connected to the light-emitting body control chip, and the negative pin is connected to the IC chip,
wherein the IC chip further comprises an IC positive electrode and an IC negative electrode, the IC positive electrode is connected to the positive pin, and the IC negative electrode is connected to the negative pin; and
the light-emitting body control chip comprises a chip positive electrode and a chip negative electrode, the chip positive electrode is connected to the positive pin, and the chip negative electrode is connected to the IC chip.

17. The LED lamp group according to claim 16, wherein the positive pin, the negative pin and the input pin are arranged horizontally in sequence from left to right.

* * * * *